United States Patent
Kim et al.

[11] Patent Number: 5,939,776
[45] Date of Patent: *Aug. 17, 1999

[54] LEAD FRAME STRUCTURE HAVING NON-REMOVABLE DAM BARS FOR SEMICONDUCTOR PACKAGE

[75] Inventors: Dong You Kim; Teck Gyu Kang, both of Choongcheongbuk-Do, Rep. of Korea

[73] Assignee: LG Semicon Co., Ltd., Choongcheongbuk-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/855,366

[22] Filed: May 13, 1997

[30] Foreign Application Priority Data

May 17, 1996 [KR] Rep. of Korea .................. 96-16643

[51] Int. Cl.$^6$ ................... H01L 23/58; H01L 23/495
[52] U.S. Cl. ................ 257/667; 257/666; 257/676; 257/787; 257/670; 257/692
[58] Field of Search ............ 257/667, 666, 257/476, 787, 670, 692, 669, 668; 438/123

[56] References Cited

U.S. PATENT DOCUMENTS

| | | |
|---|---|---|
| 4,477,827 | 10/1984 | Walker et al. ................ 257/670 |
| 4,829,362 | 5/1989 | Tran et al. .................. 257/670 |
| 5,137,479 | 8/1992 | Ohikata et al. ................ 257/667 |
| 5,202,577 | 4/1993 | Ichigi et al. ................. 257/667 |
| 5,285,104 | 2/1994 | Kondo et al. ................ 257/666 |
| 5,343,072 | 8/1994 | Imai et al. .................. 257/467 |
| 5,343,615 | 9/1994 | Sono et al. .................. 29/827 |
| 5,473,189 | 12/1995 | Nakanishi ................... 257/670 |
| 5,559,372 | 9/1996 | Kwon ....................... 257/692 |
| 5,587,606 | 12/1996 | Sekiba ...................... 257/670 |
| 5,592,020 | 1/1997 | Nakao et al. ................. 257/692 |
| 5,619,065 | 4/1997 | Kim ........................ 257/673 |
| 5,637,914 | 6/1997 | Tanaka et al. ................ 257/666 |
| 5,637,923 | 6/1997 | Kasai et al. ................. 257/730 |
| 5,686,698 | 11/1997 | Mahadevan et al. ............. 257/670 |
| 5,736,432 | 4/1998 | McKessy .................... 257/676 |
| 5,767,527 | 6/1998 | Yoneda et al. ................ 257/787 |

FOREIGN PATENT DOCUMENTS

| | | | |
|---|---|---|---|
| 1-287937 | 11/1989 | Japan | 257/692 |
| 3-69130 | 3/1991 | Japan | 257/692 |
| 4-243156 | 8/1992 | Japan | 257/692 |
| 5-121618 | 5/1993 | Japan | 257/670 |

*Primary Examiner*—Alexander Oscar Williams

[57] ABSTRACT

A lead frame structure of a semiconductor package including a plurality of leads, a respective dam bar extended from at least one of the plurality leads toward an adjacent lead and having a certain distance provided between the respective dam bar and the adjacent lead, and an insulating adhesive member is filled between the leads and the dam bars. The lead frame structure prevents leads from bending or twisting.

19 Claims, 2 Drawing Sheets

LEAD FRAME STRUCTURE HAVING NON-REMOVABLE DAM BARS FOR SEMICONDUCTOR PACKAGE

BACKGROUND OF THE INVENTION

1. Field of the Invention

The present invention relates to a semiconductor package, and more particularly to a lead frame structure for a semiconductor package having an improved dam bar structure.

2. Description of the Prior Art

In recent years, as a semiconductor package becomes largely integrated while having multi-pins therein, the pitch between leads of a lead frame also becomes minute.

As shown in FIG. 1A illustrating a plan partial view of a general lead frame, and FIG. 1B detailing portion "a" in FIG. 1A, a plurality of leads 1 including inner leads 3 provided in a molding portion 2 and outer leads 4 provided outside the molding portion 2, are connected to each other and extended from and supported by a dam bar 5 which serves to prevent the epoxy resin from externally leaking during the molding process. The dam bar 5 is completely removed by a trimming process after molding so as to prevent each of the leads 1 from being electrically shorted by the dam bar 5.

However, during the trimming process, there occurs a bending of the leads 1 due to the pressure of the cutting mold or the sweeping phenomenon in which the leads 1 are tilted and gathered to one side thereof, resulting in inferior semiconductor packages. Such a disadvantage has been more critical for a QFP package (quad flat package) which has a thinner thickness and narrower pitches between leads.

To solve the aforementioned disadvantage, a lead frame structure without a dam bar was introduced in Japanese Patent Publication No. 6-236952, and will be now described with reference to FIG. 2.

To respective upper surfaces of a plurality of leads 10 there is attached an insulating adhesive tape 11 instead of a dam bar to support the plurality of leads 10 and to prevent an epoxy resin from externally leaking.

Such a lead frame is not required to remove the insulating adhesive tape 11 functioning as the dam bar, during the trimming process to prevent the bending or sweeping phenomenon.

However, in the above-mentioned lead frame without a dam bar, the insulating adhesive tape 11 supporting the plurality of leads 10 tends to become ruptured due to the molding pressure, thus exposing the epoxy resin.

SUMMARY OF THE INVENTION

Accordingly, it is an object of the present invention to provide a lead frame structure for a semiconductor package which makes it possible to prevent epoxy resin leakage from occurring as a result of the dam bar removal during the trimming process and to prevent the leads from bending or twisting.

To achieve the above-described object, a lead frame structure for a semiconductor package, according to the present invention, provides a plurality of leads, a respective dam bar extending from at least one of the plurality of leads toward an adjacent lead and providing a predetermined distance between the respective dam bar and the adjacent lead, and an insulating adhesive disposed between the leads and the dam bars.

The lead frame structure for the semiconductor package according to the present invention includes a respective pair of first dam bars extended from a corresponding lead toward an adjacent lead having a distance disposed between a corresponding one of the first dam bar and the adjacent lead. A respective pair of second dam bars is extended from a corresponding lead toward an adjacent lead having a distance disposed between a corresponding one of the first dam bar and the adjacent lead and provided in parallel with the first dam bars. An insulating adhesive member is filled between the leads and the dam bars.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become aparent to those skilled in the art from this detailed decriptions.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE PREFERRED EMBODIMENTS

With reference to the accompanying figures, a lead frame structure of a semiconductor package according to the present invention will now be described.

Figure 3A:
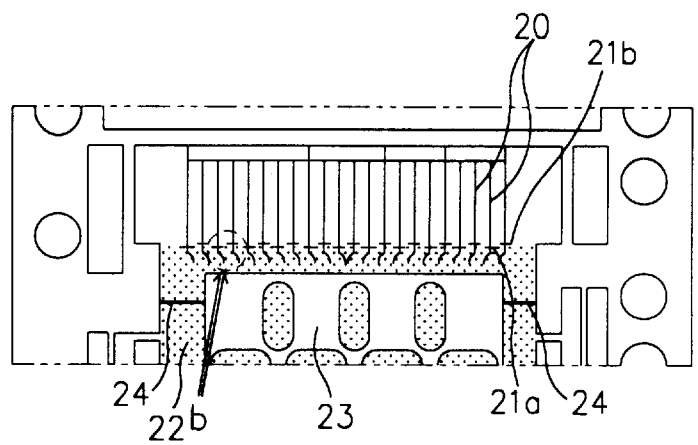
FIG. 3A is a partial plan view of a lead frame of a semiconductor package according to a first embodiment of the present invention.
Figure 3B:
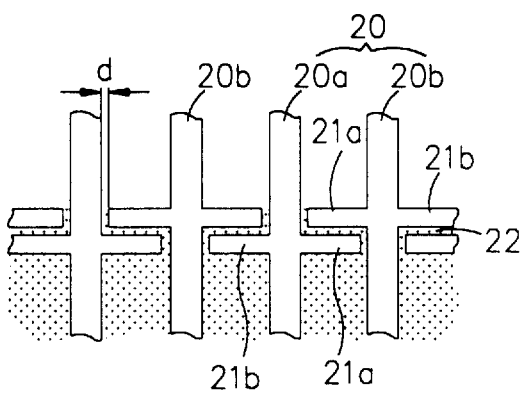
FIG. 3B is a detailed view of portion "b" in FIG. 3A.

FIG. 3A illustrates a partial plan view of a lead frame according to the first embodiment of the present invention and FIG. 3B shows a detailed view of portion "b" in FIG. 3A. A paddle 23 which is provided for receiving a semiconductor chip (not shown) is supported by a pair of tie bars 24. A plurality of leads 20 are disposed in an array outside of the paddle 23. The structure, which has respective pairs of dam bars of a lead frame, includes a first dam bar 21a which extends from a corresponding lead 20a toward an adjacent lead 20b to define a distance "d" between the first dam bar 21a and the adjacent lead 20b, and a second dam bar 21b provided in parallel with the first dam bar 21a and also defining a certain distance "d" between the second dam bar 21b and the adjacent lead 20a.

The plurality of first dam bars 21a and second dam bars 21b are alternately provided but are non-abutting and parallel to each other so that the respective leads 20 are not electrically shorted. That is, the first and second dam bars 21a, 21b are arrayed so as to be adjacent and parallel to each other.

The first dam bars 21a are arrayed in a molding region but the second dam bars 21b are provided outside the molding region and parallel to the respective first dam bars 21a for obtaining an array which is adjacent and parallel to each other.

Between the first and second dam bars 21a, 21b there is provided an insulating adhesive member 22 such as an insulating film formed of a polyamide, an insulating paste, or an epoxy resin so as to support the respective leads 20, thereby preventing the leads 20 from becoming bent, or becoming electrically connected to each other.

Figure 1A:
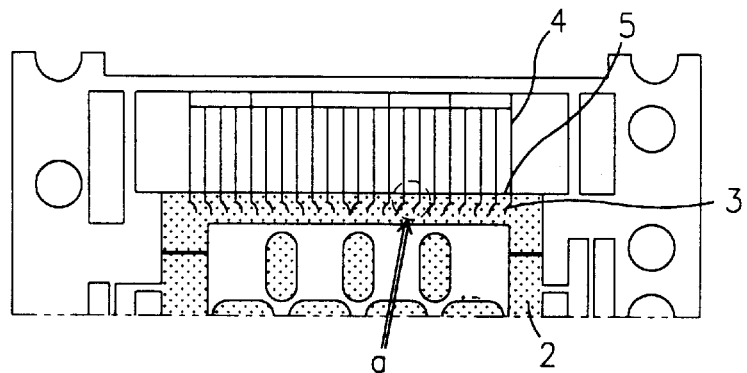
FIG. 1A is a partial plan view of a conventional lead frame of a semiconductor package.
Figure 1B:
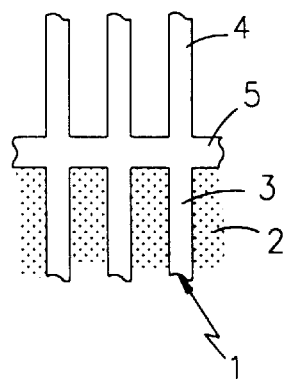
FIG. 1B is a detailed view of portion "a" in FIG. 1A.
Figure 2:
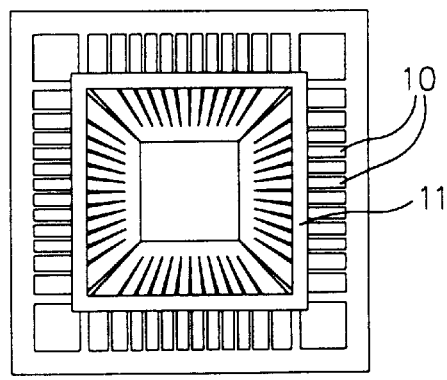
FIG. 2 is a partial plan view of a conventional lead frame not utilizing a dam bar of a semiconductor package.

The lead frame according to the present invention as shown in FIGS. 3A and 3B has a double structure formed of the first and second dam bars 21a, 21b which are separated from each other, as compared to the conventional dam bar 5 shown in FIGS. 1A and 1B. The spaces between the respective dam bars 21a, 21b are sealed with the insulating adhesive member 22 thus preventing the respective leads from being electrically connected to each other, whereby a dam bar removal process is not required which has been carried out during a trimming process in a semiconductor package fabrication.

Figure 4:
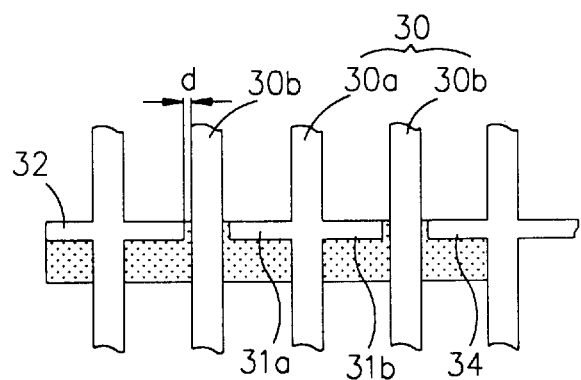
FIG. 4 is a partial plan view of a lead frame of a semiconductor package according to a second embodiment of the present invention.

As shown in FIG. 4 illustrating the second embodiment of the present invention, a lead 30a is provided with a respective pair of dam bars 31a and 31b each separated from adjacent leads 30b with a distance "d" disposed therebetween. Between the dam bars 31 and the leads 30 there is disposed an insulating adhesive member 34 such as an insulating film formed of polyamide, an insulating paste or an epoxy resin.

As described above, the lead frame structure according to the present invention, completely prevents leads from bending or twisting which may occur while removing the dam bars, because the present invention provides a plurality of double-structured dam bars which are separated from each other so that the dam bar is not required to be removed during a trimming process, thereby facilitating a trimming mold design and preventing the rupture of dam bars and resulting leakage of an epoxy resin in accordance with the molding pressure during the molding process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A lead frame structure for a semiconductor package, comprising:

a plurality of leads;

a plurality of dam bars, each extending from one of the plurality leads toward an adjacent lead so that a gap is provided between said each dam bar and the adjacent lead; and an insulating adhesive disposed between said each dam bar and the adjacent lead and completely filling the first gap, wherein each of the leads have a first dam bar of the plurality of dam bars extending from one side of said lead, and a second dam bar of the plurality of dam bars extending from another side of said lead, the first and second dam bars substantially aligned with each other, wherein the first dam bar of one lead extends immediately adjacent and substantially parallel to the second dam bar of another lead.

2. The structure of claim 1, wherein the insulating adhesive is formed of one of an insulating film, an insulating paste, and an epoxy resin.

3. The structure of claim 2, wherein the insulating film is a polyamide.

4. A lead frame structure for a semiconductor package, comprising:

first and second leads disposed in juxtaposition;

a pair of first dam bars extending from one portion of the first lead in opposite directions towards adjacent leads and forming a first gap between an end portion of one of the first dam bars and the second lead;

a pair of second dam bars extending from a portion of the second lead in opposite directions towards adjacent leads and forming a second gap between an end portion of one of the second dam bars and the first lead, a third gap being formed between the one of the first dam bars and the one of the second dam bars; and an insulating adhesive disposed between the first and second leads and completely filing the first, second and third gaps, wherein the pair of first dam bars are aligned substantially with each other, the pair of second dam bars are aligned substantially with each other, and the pair of first dam bars and the pair of second dam bars are substantially parallel to each other.

5. The structure of claim 4, wherein the insulating adhesive is formed of one of an insulating film, an insulating paste, and an epoxy resin.

6. The structure of claim 5, wherein the insulating film is a polyamide.

7. A lead frame structure for a semiconductor package comprising:

first and second plurality of leads disposed in juxtaposition and in an alternating pattern;

a plurality of dam bars extending from opposite sides of said first plurality of leads, gaps formed between the second leads and the dam bars, the second plurality of leads being without any dam bars; and an adhesive disposed between the first and second leads and filling the gaps.

8. The structure of claim 7, wherein the dam bars are substantially aligned with each other.

9. The structure of claim 1, wherein each of the first and second dam bars are substantially perpendicular to said lead.

10. The structure of claim 1, wherein all of ends of the dam bars which contact the insulating adhesive have a substantially rectangular end.

11. The structure of claim 7, wherein the adhesive completely fills each of the gaps between one dam bar and adjacent second lead and prevents passing of a molding material between the first and second leads.

12. The structure of claim 1, wherein the plurality of dam bars are non-removable after a molding process of the semiconductor package.

13. The structure of claim 1, wherein the insulating adhesive fills any gap between said each dam bar and the adjacent lead.

14. The structure of claim 4, wherein the pair of first dam bars are non-removable after a molding process of the semiconductor package.

15. The structure of claim 14, wherein the pair of second dam bars are also non-removable after the molding process.

16. The structure of claim 4, wherein the insulating adhesive fills any gap between said one of the first dam bars and the second lead and any gap between said one of the second dam bars and the first lead.

17. The structure of claim 7, wherein the plurality of dam bars are non-removable after a molding process of the semiconductor package.

18. The structure of claim 7, wherein the adhesive is formed with one of an insulating film, an insulating paste and an epoxy resin.

19. The structure of claim 7, wherein the adhesive includes polyamide.

* * * * *